United States Patent [19]

Guillemot

[11] Patent Number: 4,463,343
[45] Date of Patent: Jul. 31, 1984

[54] METHOD OF AND DEVICE FOR INCREMENTAL ANALOGUE-TO-DIGITAL CONVERSION

[75] Inventor: Philippe Guillemot, Paris, France

[73] Assignee: Mecilec, France

[21] Appl. No.: 311,746

[22] Filed: Oct. 15, 1981

[30] Foreign Application Priority Data

Oct. 16, 1980 [FR] France .................................. 80 22104

[51] Int. Cl.³ ............................................ H03K 13/02
[52] U.S. Cl. ........................ 340/347 AD; 340/347 SH
[58] Field of Search ................. 340/347 SH, 347 AD, 340/146, 3 AG; 375/27

[56] References Cited

U.S. PATENT DOCUMENTS

| | | | |
|---|---|---|---|
| 3,225,213 | 12/1965 | Hinrichs | 340/146.3 AG |
| 3,588,884 | 6/1971 | Quereshi | 340/347 AD |
| 3,657,653 | 4/1972 | Wilkinson | 375/27 |
| 3,745,562 | 7/1973 | Rosenbaum | 340/347 AD |
| 3,753,133 | 8/1973 | Shumate, Jr. | 328/151 |
| 4,310,830 | 1/1982 | Babini | 340/347 AD |

FOREIGN PATENT DOCUMENTS 6023 12/1979 European Pat. Off. .
2049400 3/1971 France .
2344816 10/1977 France .

Primary Examiner—C. D. Miller
Attorney, Agent, or Firm—Steinberg & Raskin

[57] ABSTRACT

In a method of converting an analog input signal to a digital output signal, an analog input voltage is compared with two reference magnitudes which are invariable during the comparing. Both reference magnitudes are derived from an analog signal provided in a previous comparison by adding and subtracting a fixed magnitude representing a quantization step. Both reference magnitudes are simultaneously varied by increments or decrements equal to the steps when the analog input voltage is equal to one or the other of the reference magnitudes. Upon each variation, a pulse is emitted having a plus sign or a minus sign according to whether the analog input voltage reaches one or the other of the reference magnitudes. The number of pulses emitted is algebraically totalled thereby providing a digital indication of the mangitude of the analog input voltage.

7 Claims, 6 Drawing Figures

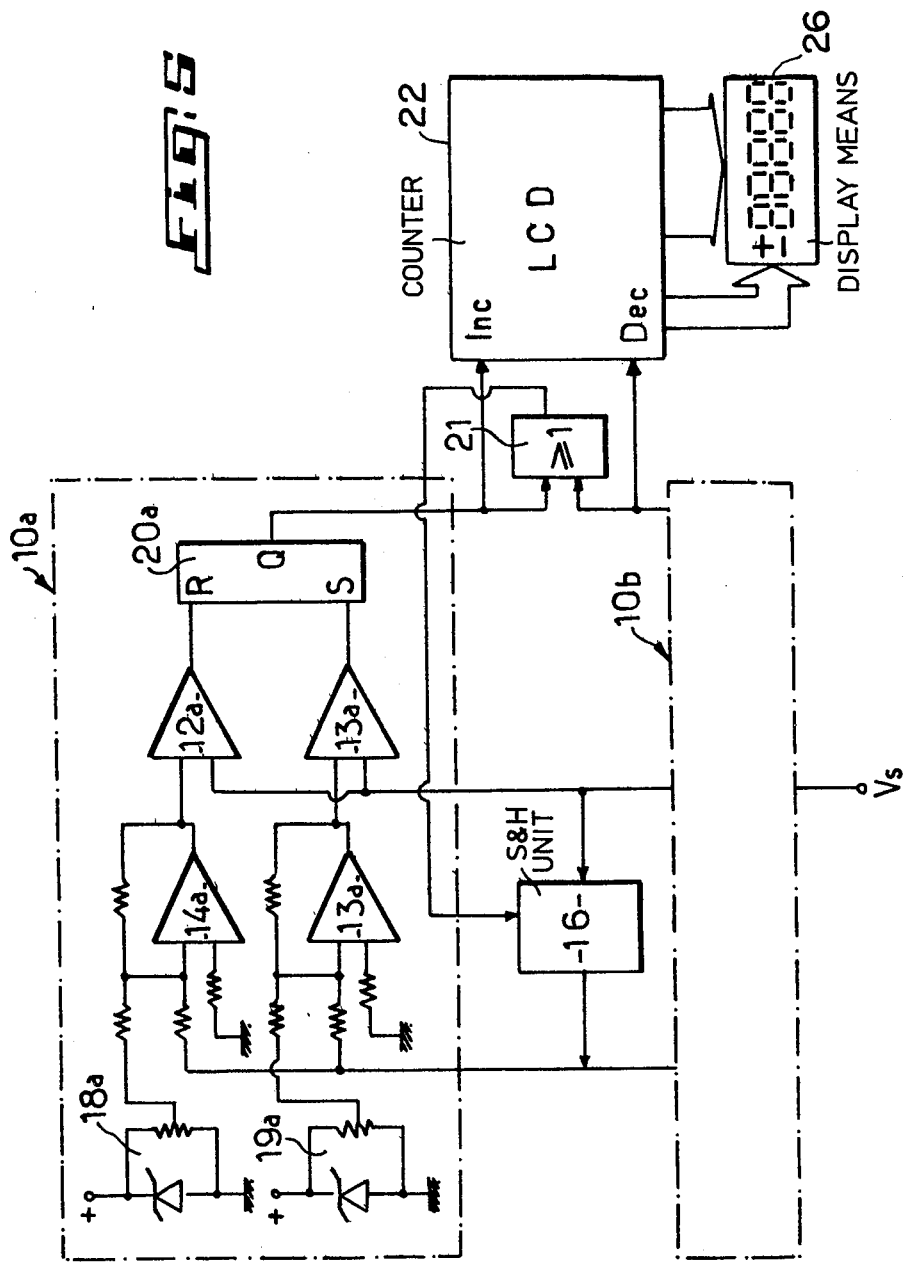

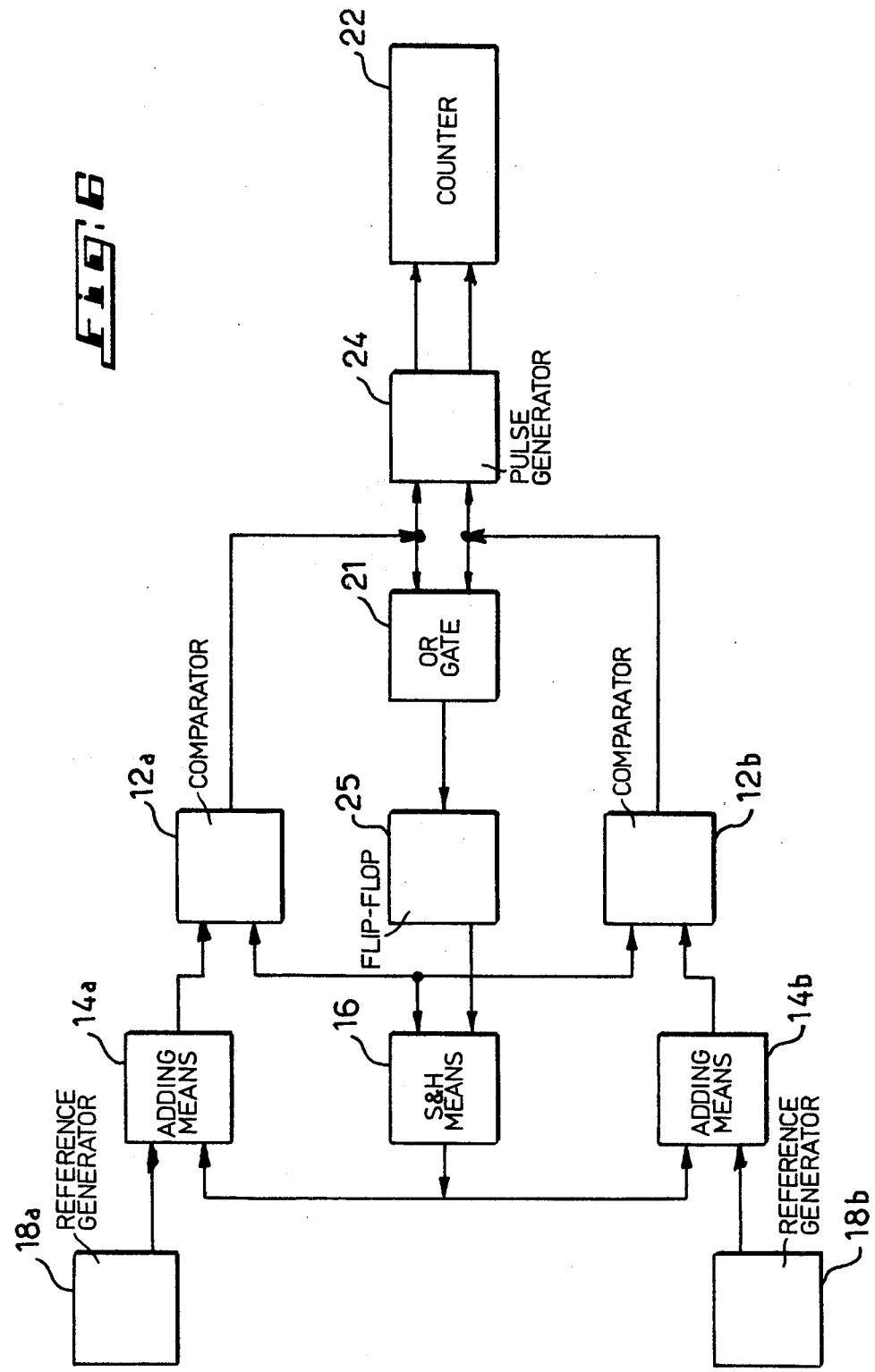

METHOD OF AND DEVICE FOR INCREMENTAL ANALOGUE-TO-DIGITAL CONVERSION

BACKGROUND OF THE INVENTION

The present invention relates to an analogue-to-digital converter capable of providing a digital signal representative of an input value consisting of an analogue electric signal. It is applicable every time it is necessary to provide a digital representation of a physical value susceptible of being measured by sensors, detectors or like pick-off transducers having an electric output. It is in particular usable in digital voltmeters and ammeters which display in a digital form the magnitude of a voltage or of a current. It is, however, of course, also usable when the digital output signal is applied to a complex processing system.

A great number of existing so-called A/D analogue-to-digital converters are adapted to make possible the display of the value of an input signal as a directly readable decimal number or the subsequent processing in the binary logic mode. Such analogue-to-digital converters are of several types the main ones of which are the successive approximation type, the single or double slope integration type and the stochastic type. These various kinds of converters has advantages and disadvantages, so that either one may be preferred depending on the prevailing requirement, for example, according to whether a short conversion time or a high resolution is essentially wanted. The known analogue-to-digital converters however exhibit common characteristic features which are inconveniences in many cases. The digital output signal is supplied in the form of a binary word having a number of significant bits which are provided in parallel, which number depends on the full-scale resolution. If it is desired to make the converter an integrated circuit, the integration density would increase exponentially with the number of significant bits, that is, with the resolution. The basic diagram would depend on the desired characteristics thereby causing compatibility problems when developing a system. With a given resolution, the cost price of the converter would increase very rapidly with the dynamic sought, for example, when changing from an eight-bit resolution to a sixteen-bit resolution.

SUMMARY OF THE INVENTION

The object of the invention is to provide a method of and a device for analogue-to-digital conversion meeting the requirements of practice better than known methods and devices, in particular, retaining: the basic diagram invariable whatever the characteristics sought (in particular dynamic and resolution) may be, particularly dynamics and resolution, thereby resulting in full compatibility. The device of the invention may be made as an integrated circuit with the same number of components and the same integration density, whatever the characteristics may be, and provides the output signal as series pulses.

For that purpose, the invention provides in particular a method of analogue-to-digital conversion characterized in that it consists of comparing an analogue electric input signal to two thresholds separated from each other by a determined interval representing a quantization step, simultaneously varying both thresholds by increments or decrements equal to the step according to whether the signal is equal to either one of the thresholds, providing at each variation a pulse having a + or − sign depending on that one of the thresholds which is reached, and permanently algebraically totalizing the number of pulses.

The invention also provides a device for the analogue-to-digital conversion of an electric signal, characterized in that it comprises sample and hold means adapted to receive at its analogue input the analogue signal to be digitized. Adders add the output voltage from the sample and hold means and of the reference signals $+\Delta V$ and $-\Delta V$, respectively. Comparators compare the input voltage with the sum of the output voltage from the sample and hold means and the $+\Delta V$ and $-\Delta V$ signals representing a quantization step. Logic means connected to the comparators are adapted to generate a pulse for having the input voltage stored by the sample and hold means when the comparators sense equality and to simultaneously emit a pulse with the + or − sign according to circumstances.

The device may include one single channel operating in alternation with the $+\Delta V$ and $-\Delta V$ values. It is however much preferable to use two measuring channels corresponding to "windows" having the same absolute value $\Delta V$ but corresponding to opposite signs. In any case, each equality with $\pm \Delta V$ detected by the comparators would cause the emission of a pulse bearing the appropriate sign. Algebraic counting means such as a reversible or bi-directional or forward-backward counter is provided for totalizing the pulses and supplying a number which is a linear representation of the electric input value.

BRIEF DESCRIPTION OF THE DRAWINGS

For a fuller understanding of the invention, reference is had to the following description, taken in connection with the accompanying drawings, in which:

FIG. 5 is a block diagram of the device of FIG. 1 in greater detail; and

FIG. 6 is a block diagram of another embodiment of the analog to digital converter of the invention.

DESCRIPTION OF PREFERRED EMBODIMENTS

Figure 1:
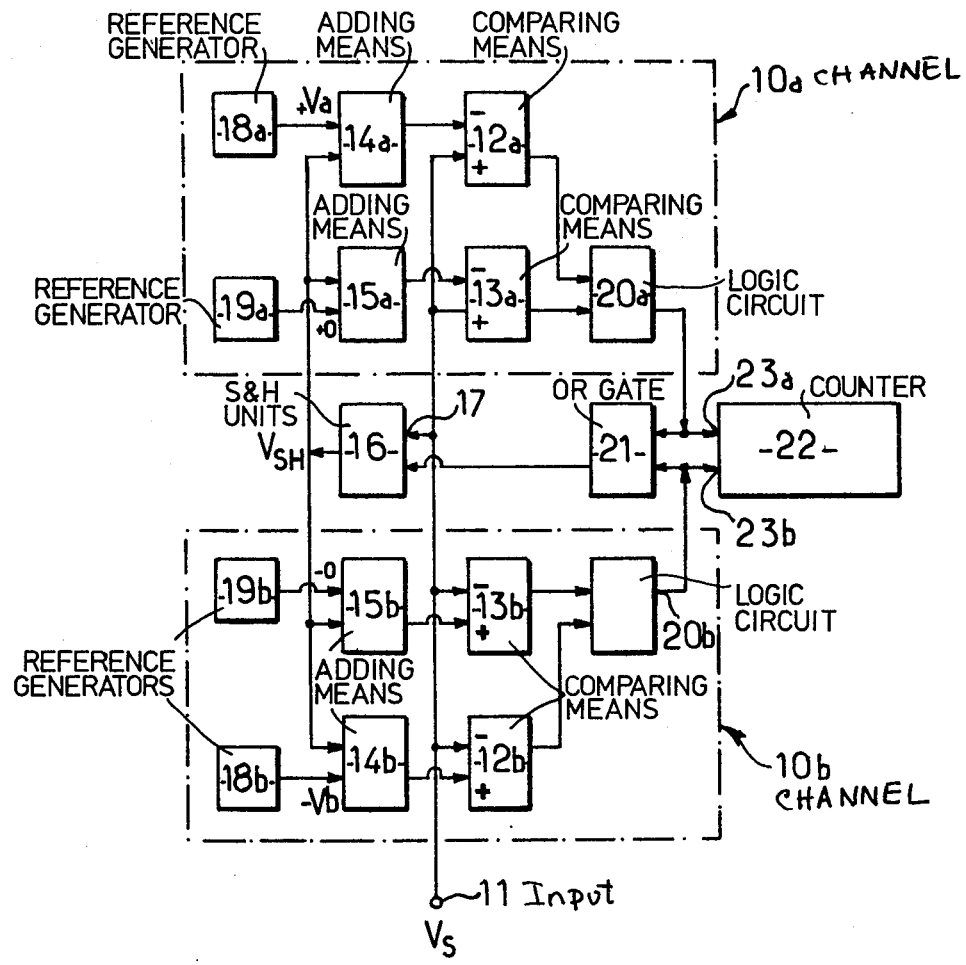
FIG. 1 is a block diagram of an embodiment of the analog to digital converter of the invention.

The device shown in FIG. 1 comprises two parallel channels 10a and 10b of the same construction which are respectively put in operation upon the increase and decrease of the analogue signal Vs applied to an input 11.

The channel 10a comprises two comparators 12a and 13a the inputs + of which are connected to the input 11 for receiving the signal Vs which will be assumed to be a voltage. The inputs − of the comparators 12a and 13a are connected to respective adding means or adders 14a and 15a. Each of the adders receives the output signal $V_{SH}$ from a sample and hold unit 16 designated in FIG. 1 by its usual shortening S & H. The analogue input of the sample and hold unit 16 is connected to the input 11.

The adders 14a and 15a also receive reference voltages fed by respective voltage generators 18a and 19a. The generator 19a supplies a voltage which should be referred to as 0+ and which theoretically is zero, but in fact is adjustable to compensate for the possible shift voltage of the adder 15a or even of the comparator 13a. The generator 18a will in turn supply a positive voltage $+V_a$, the absolute value $\Delta V$ of which corresponds to the resolution of the device.

The second channel $10b$ comprises the same elements as the channel $10a$, identified by the same reference numbers, but bearing the subscript b instead of a. The reference generators $18b$ and $19b$, however, supply stabilized voltages $-O$ and $-V_b$, respectively, corresponding again to the resolution $\Delta V$. The output of the adders $14b$ and $15b$ would this time drive the output + of the respective comparators $12b$ and $13b$ the input − of which receives the signal Vs.

Each of the channels $10a$ and $10b$ further includes logic means $20a$ or $20b$ which is generally a flip-flop circuit. The flip-flop circuits $20a$ and $20b$ drive in parallel the hold input of the sample and hold unit 16 through an OR gate 21 and also drive incremental and decremental counting means 22. The incrementing and decrementing inputs $23a$ and $23b$ are driven by the logic circuits or flip-flops $20a$ and $20b$, respectively.

Figure 3:
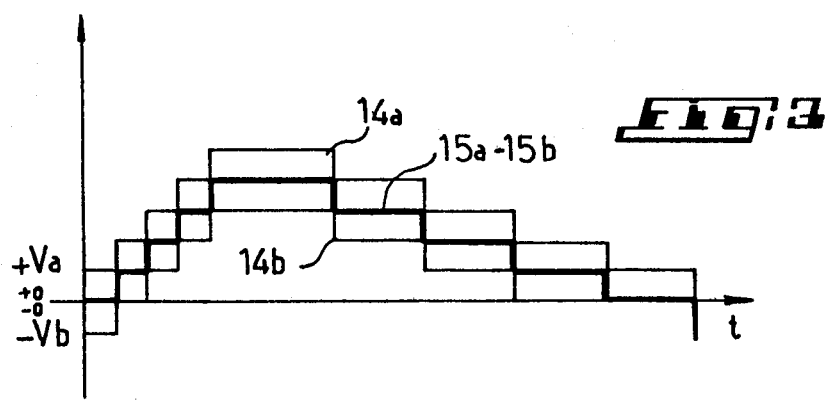
Figure 4:
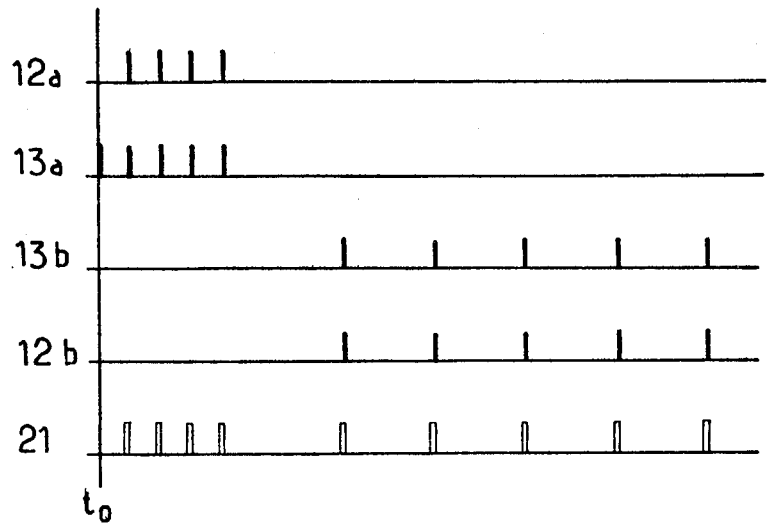

The operation of the device of FIG. 1 is now described with reference to FIGS. 2, 3 and 4.

In the initial state of the device the input voltage Vs will be assumed to be zero. This condition may always be complied with by interposing between the source of voltage to be measured and the input 11 a reset circuit in case of the absence of an input signal. The outputs of the logic circuits $20a$ and $20b$ are at the logic level "1". This logic level "1" is fed by the OR-gate 21 to the drive or control input of the sample and hold unit 13 which then is conductive to the signal applied to its input.

The signals delivered by the adders $14a$, $15a$, $15b$ and $14b$ at the time $t_0$ then are $+Va$ for $14a$, $0+$ for $15a$, $0-$ for $15b$ and $-Vb$ for $14b$, respectively, with $|Va|=|Vb|$. The output voltage $V_{SH}$ of the sample and hold unit 16 is equal to Vs, hence to zero.

On the one hand, $Vs=0$ and $+Va$ are applied to the comparator $12a$, $0+$ is applied to the comparator $13a$, $0-$ is applied to the comparator $13b$ and $-Vb$ is applied to the comparator $12b$, on the other hand.

Since the comparators $12a$ and $12b$ do not sense any equality, their inputs will remain at the logic level "0". On the contrary, the equality $Va=+0$ will be detected by the comparator $13a$ and $Vb=-0$ will be detected by the comparator $13b$ and their outputs will change to the logic level "1".

The logic circuits $20a$ and $20b$ will then feed a logic signal such as, for example, "0" to the OR-gate 21, which will then give the sample and hold unit 16 a blocking order for instance a binary "0". The sample and hold unit 16, which until then was conductive to the signal Vs hence in a sampling state will lock itself and thus store the instant analogue value Vs which is here $V_{SH}=Vs=0$.

It is seen that the comparators $12a$ and $13a$ form a "window" of detection by positive values, the low reference value of which is provided by the adder $15a$ whereas its high reference value is delivered by the adder $14a$.

Similarly, the comparators $13b$ and $12b$ form a "window" of detection by negative values which are symmetrical with respect to the other.

Figure 2:
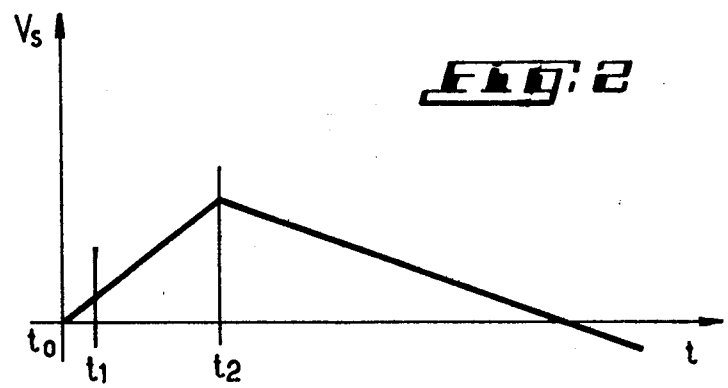
FIGS. 2, 3 and 4 are time charts showing the operation of the device of FIG. 1.

If it is now assumed that the voltage Vs increases, as shown in FIG. 2, the comparators $13a$ and $13b$ no longer sense any equality. Their outputs will return to the logic level 0. The state of the comparators $12a$ and $12b$ remains unchanged. The logic circuits $20a$ and $20b$ remain in their previous state and therefore the sample and holding unit 16 will maintain at its analogue output the signal $V_{SH}=0$ which value has been stored previously. The reversible counter 22 remains in its initial state, which is the logic level 0.

When the input signal Vs reaches the value $+Va$, at the time $t_1$, the comparator $12a$ will sense an equality. The output of the comparator $12a$ will change to the state 1 and will cause the logic circuit $20a$ to be triggered thereby resulting in the occurrence of an output transition from the state 0 to the state 1. This transition is simultaneously applied to the counter 22 which will increment by 1 and is conveyed by the OR gate 21 to the drive or control input of the sample and hold unit 16. This signal will substitute the new value of the measured signal $Vs=+Va$ for the former value at the analogue output of the sample and hold unit 16. The new value $V_{SH}=Vs=Va+$ is applied to the adding means $14a$, $15a$, $14b$, $15b$. Since the comparators $13a$, $13b$, $12b$ have not sensed any equality, they have not changed their states.

It is seen that following this drive of the sample and hold unit 16 the outputs $+2Va$, $+Va$, $+Va$ and 0 are provided at the outputs of the adders $14a$, $15a$, $15b$ and $14b$, respectively. The reference values applied to the comparators are shifted by $+Va$ and are shown by the first step of the stepped curves $14a$, $15a$, $15b$ and $14b$ in FIG. 3.

This shift of the voltage reference values triggers the comparator $12a$ so that its output will return to the logic state 0 as soon as it no longer senses any equality and triggers the comparator $13a$ which, on the contrary, detects an equality and the output of which will change from the state 0 to the state 1. The logic circit $20a$ again forwards a logic signal "0" which will supply an inhibiting order to the sample and hold unit 16. It is seen that the output of the comparator $13a$ will change to the state "1" as soon as the comparator $12a$ has changed its logic state. The logic circuit $20a$ then conveys a sampling order to the sample and hold unit 16 as soon as the comparator $13a$ has changed its state, whereby the sampling speed of the device is increased.

The comparators $13b$ and $12b$, on the contrary, remain in the same state. Although the comparator $13b$ senses an equality between its two inputs, it does not change its state, because it is designed not to be triggered when the signal Vs is increasing (detection by negative values). The comparator $12b$ does not sense any equality.

It is seen that one of the inputs of the logic circuit $20a$ changes from 1 to 0 and the other changes from 0 to 1. Its output is triggered from the state 1 to the state 0 and accordingly the output of the gate 21 changes to 0; both these inputs being in the zero state. The sample and hold unit 16 is locked and stores the value $Vs=+Va$ present at its analogue input and supplies it to its output $V_{SH}$.

The operation is thus going on with a successive shift of the reference values in the direction of increase as long as the voltage Vs increases. When, on the contrary, the voltage Vs decreases from the time $t_2$, it is the second channel $10b$ of the device which becomes operative for shifting the reference values by successive steps $\Delta V$ in the direction of decrease. The signals which appear at the outputs of the comparators $12a$, $13a$, $12b$ and $13b$ have the pattern shown in the corresponding lines of FIG. 4. The last line of FIG. 4 shows short rectangular signals applied on the drive input of the sample and hold unit 16 by the gate 21.

The device of FIG. 1 may be constructed various ways. Many electronic components are known which are capable of fulfilling the functions required from each of the components.

The voltage generator 18a and 18b may be of any type capable of supplying an accurately stabilized reference voltage. In particular, they may consist of diodes, Zener diodes and stabilized voltage generating circuits providing temperature compensation.

The adders 14a, 15a, 15b and 14b adapted to supply the sum of two analogue signals may consist of a circuit with discrete transistors, operational amplifiers, and so on.

The comparators 12a, 13a, 13b and 12b are adapted to supply a logic output signal which has one value when the analogue input signals are equal and another value when these signals are different. Many circuits fulfilling such a function are known.

The logic circuits 20a and 20b have to comply with a truth table which depends on the construction of the gate 21 and of the sample and hold unit 16. As a general rule, it is desirable to select a logic circuit complying with the following truth table, for the logic circuit 20a, or its logical inversion.

| Inputs | | Outputs S |
|---|---|---|
| 0 | 0 | Previous stored state |
| 1 | 0 | 1 |
| 0 | 1 | 0 |

The OR gate 21 is of conventional design. Its truth table is selected according to those of the logic circuits 20a and 20b. The reversible counter 22 is of any type which totals the number of increments and the number of decrements received at its inputs. This type of counter is generally associated with digital display means.

The circuit or device of the invention permits the selection of any quantization step $\Delta V$ which may in particular represent a voltage unit such as, for example, 1 mV, 10 mV, 1 V, etc. The output of the counter 22 will then supply a value directly readable in current units. It is thus possible to select the smallest possible quantization step $\Delta V$ which corresponds to a higher resolution of the device.

It should however be pointed out that the counter 22 should assign a sign to the absolute value constituted by the number of increments. This sign may be determined by comparison between the initial value, that is zero and the first measurement performed. If the first 1 is due to an increase of the signal, the counter will increment itself normally and the sign + will be given by the display means, whereas if the first 1 is due to the decreasing variation of the signal the counter will have its forward and backward counting inputs reversed, for example. The negative sign − will be displayed. The pulses corresponding to an increase of the measured signal will then increment the counter 22 whereas the pulses corresponding to an increase of the measured signal will decrement them. The counter 22 may consist of a set of reversible, bidirectional or forward-backward counters provided with a comparing device for zero detection of a microprocessor or any other specialized circuit. FIG. 5 shows a possible design of the circuit or device supplying the measurement of the voltage Vs to a display means with seven segments, the counting means being provided with a binary-decimal converter. In FIG. 5, components similar to those of FIG. 1 are identified by the same reference numerals. The channel 10a comprises reference voltage generators 18a and 19a utilizing a Zener diode as the voltage stabilizing element. Each of the adders 14a and 15a consists of an operational amplifier having an input grounded through a resistor and another input to which the reference voltage and the output voltage from the sample and hold unit 16 are applied via parallel resistors. The comparators and the logic circuit 20a, which is a conventional RS flip-flop, consist of commercially available circuits.

The channel 10b may have the same design as that of the channel 10a and therefore is not shown in detail.

The logic circuit 21 may consist of a conventional OR gate.

When it is desired to give the device a long response time it is preferable to utilize bipolar transistors in the circuits. It is especially possible when the device consists of emitter-coupled logic circuits ECL to use the following components. The adder may be HA 4625. The comparator may be HA 4905. The RS flip-flop circuit may be CD 4044. The OR gate may be CD 4001. The sample and hold unit may be HA 2425. The forward-backward counter may be ICM 7227. The display means may be FND 500.

If a sufficiently quick-acting sample and hold unit is available it is possible to simplify the basic circuit of FIG. 1 by omitting, in each channel, the zero reference and the elements associated therewith.

By way of illustrative example, FIG. 6 shows such a device wherein the same circuit components as in FIG. 1 are identified by the same reference numerals. The outputs of the comparators 12a and 12b are applied to one of the inputs of the OR gate 21, as well as to a corresponding input of a pulse generator circuit 24 which supplies a calibrated pulse for incrementing or decrementing the counter or counters 22 in response to each pulse delivered by the comparator. The output of the OR gate 21 drives a calibrated pulse generating circuit 25 which may consist of a monostable flip-flop.

The calibrated output pulse from the pulse generator circuit 25 has to provide for the sampling of the input voltage Vs of the sample and hold unit 16 and for its storage.

The proper operation of such a device requires the sample and hold unit 16 to have a speed of acquisition high enough to enable said unit to catch up with the voltage Vs applied to its analogue input.

It is not necessary to describe the operation of the circuit or device of FIG. 6 since it may be derived in a straightforward manner from that of FIG. 1.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An analog to digital converter, comprising
a sample and hold circuit having an analog input to which is applied an analog input voltage to be digitized, a second input and an output at which an output voltage is provided;
adding means having outputs, first inputs to which reference signals $+\Delta V$ and $-\Delta V$ representing a quantization step are applied and second inputs connected to the output of said sample and hold circuit for adding the output voltage of said sample and hold circuit with said reference signals $+\Delta V$ and $-\Delta V$;
comparator means having outputs, inputs connected to the outputs of said adding means for comparing the sum of the output voltage of said sample and hold means and said reference signal $+\Delta V$ or $-\Delta V$ representing a quantization step with said input voltage;
logic means having inputs connected to the outputs of said comparator means and outputs coupled to the second input of said sample and hold circuit for emitting a pulse for storing said analog input voltage in said sample and hold circuit when said comparator means detects equality between said analog input voltage and one or the other value of said sum and for simultaneously emitting a pulse having a plus sign or a minus according to whether said analog input voltage reaches one or the other value of said sum; and
totalling means having inputs connected to the outputs of said logic means for algebraically totalling the number of pulses emitted by said logic means thereby providing a digital indication of the magnitude of said analog input voltage.

2. An analog to digital converter as claimed in claim 1, wherein said totalling means comprises a reversible counter.

3. An analog to digital converter as claimed in claim 1, wherein said comparator means includes a plurality of comparators, and further comprising two channels, each including two of said comparators, one of said comparators in each of said channels being connected to compare said analog input voltage with the sum of a reference voltage $+0$ or $-0$ and said output voltage of said sample and hold circuit and the other of said comparators in each of said channels being connected to compare said analog input voltage with the sum of said output voltage of said sample and hold circuit and said reference signal $+\Delta V$ or $-\Delta V$ of the corresponding channel and representing said quantizing step.

4. An analog to digital converter as claimed in claim 3, further comprising a plurality of voltage generators each having an output and providing at said output a reference signal voltage having an absolute value equal to said quantizing step $\Delta V$ or a zero voltage, wherein said adding means includes a plurality of adders each having an input connected to the output of said sample and hold circuit and another input connected to the output of a corresponding one of said voltage generators and output, each of said comparators being connected to the output of a corresponding one of said adders and said reference signal voltage of each of said voltage generators compensating for voltage shift of the adder connected thereto and of the comparator connected to said adder.

5. An analog to digital converter as claimed in claim 3, wherein said logic means comprises a pair of flip-flops, one in each of said channels, each of said flip-flops having a pair of logic inputs each connected to the output of a corresponding one of the comparators of the channel in which said flip-flop is connected and an output, and further comprising a gate connected between the outputs of said flip-flops and the second input of said sample and hold circuit.

6. An analog to digital converter as claimed in claim 1, wherein said comparator means includes a plurality of comparators, and further comprising two channels, each including one of said comparators connected to compare said analog input voltage with the sum of said output voltage of said sample and hold circuit and said reference signal $+\Delta V$ or $-\Delta V$ of the corresponding channel and representing said quantizing step, said logic means coupling said comparators to the second input of said sample and hold circuit.

7. An analog to digital converter as claimed in claim 6, wherein each of said comparators has an output and said logic means comprises a first pulse generator having a pair of inputs and outputs connected to said totalling means, a second pulse generator having an input and an output connected to the second input of said sample and hold circuit and a gate having a pair of inputs connected to the inputs of said first pulse generator and an output connected to the input of said second pulse generator, the output of each of said comparators being connected to a corresponding one of the common connections between the inputs of said first pulse generator and said gate.

* * * * *